United States Patent
Huang et al.

(10) Patent No.: US 7,221,039 B2
(45) Date of Patent: May 22, 2007

(54) THIN FILM TRANSISTOR (TFT) DEVICE STRUCTURE EMPLOYING SILICON RICH SILICON OXIDE PASSIVATION LAYER

(75) Inventors: Kun-Ming Huang, Taipei (TW); Cheng-Fu Hsu, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 62 days.

(21) Appl. No.: 10/876,010

(22) Filed: Jun. 24, 2004

(65) Prior Publication Data

US 2005/0285233 A1    Dec. 29, 2005

(51) Int. Cl.
*H01L 23/58* (2006.01)

(52) U.S. Cl. ............... 257/646; 257/646; 257/59; 257/395; 257/E51.005

(58) Field of Classification Search ............ 257/646, 257/59, 396
See application file for complete search history.

(56) References Cited

U.S. PATENT DOCUMENTS

| | | | | |
|---|---|---|---|---|
| 5,166,816 | A | * | 11/1992 | Kaneko et al. ............ 257/59 |
| 5,648,662 | A | * | 7/1997 | Zhang et al. ............. 257/59 |
| 5,763,937 | A | * | 6/1998 | Jain et al. ............... 257/646 |
| 6,274,429 | B1 | | 8/2001 | Misra |
| 6,421,108 | B1 | | 7/2002 | Chen et al. |

* cited by examiner

*Primary Examiner*—Andy Huynh
*Assistant Examiner*—Thinh T Nguyen
(74) *Attorney, Agent, or Firm*—Tung & Associates

(57) ABSTRACT

A thin film transistor device structure and a method for fabricating the thin film transistor device structure each comprise a thin film transistor device formed over a substrate. The thin film transistor device structure also comprises a passivation layer formed of a silicon rich silicon oxide material formed over the thin film transistor device. The passivation layer formed of the silicon rich silicon oxide material provides the thin film transistor device with enhanced performance.

6 Claims, 1 Drawing Sheet

THIN FILM TRANSISTOR (TFT) DEVICE STRUCTURE EMPLOYING SILICON RICH SILICON OXIDE PASSIVATION LAYER

BACKGROUND OF THE INVENTION

1. Field of the Invention

The invention relates generally to liquid crystal display devices. More particularly, the invention relates to liquid crystal display devices with enhanced performance.

2. Description of the Related Art

Computer displays, and in particular liquid crystal display (LCD) computer displays, employ thin film transistor (TFT) devices as actuation devices for effecting alignment of liquid crystal materials. In turn, the alignment of liquid crystal materials within liquid crystal displays provides for light modulation within the liquid crystal displays and thus proper operation of the liquid crystal displays.

While thin film transistor devices and related liquid crystal display driver devices are generally essential within the liquid crystal display art, they are nonetheless not entirely without problems.

In that regard, it is often difficult to provide thin film transistors with optimal electrical performance within liquid crystal displays. The electrical performance in turn provides for proper operation of the liquid crystal displays.

The present invention is thus directed towards providing thin film transistor devices with enhanced performance.

SUMMARY OF THE INVENTION

A first object of the invention is to provide a thin film transistor device.

A second object of the invention is to provide a thin film transistor device with enhanced performance.

In accord with the objects of the invention, the invention provides a thin film transistor device structure and a method for fabricating the thin film transistor device structure.

In accord with the invention, the thin film transistor device structure comprises a thin film transistor device formed over a substrate, as well as a passivation layer formed over the thin film transistor device. Within the invention, the passivation layer is formed of a silicon rich silicon oxide material.

The invention provides a thin film transistor device with enhanced performance.

The invention realizes the foregoing object within the context of a thin film transistor device structure having formed therein a thin film transistor device. The thin film transistor device structure also comprises a passivation layer formed over the thin film transistor device. The passivation layer is formed of a silicon rich silicon oxide material, such as to provide enhanced performance of the thin film transistor device.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a thin film transistor device fabricated with enhanced performance.

The invention realizes the foregoing object within the context of a thin film transistor device structure having formed therein a thin film transistor device. The thin film transistor device structure comprises a passivation layer formed over the thin film transistor device. The passivation layer is formed of a silicon rich silicon oxide material, such as to provide enhanced performance of the thin film transistor device.

Although the preferred embodiment of the invention illustrates the invention within the context of an inverted thin film transistor device having enhanced threshold voltage performance, the invention is not intended to be so limited. Rather the invention may be employed within non-inverted thin film transistor devices (where a gate electrode is on an opposite side of a active semiconductor layer from a substrate, as analogous with a conventional field effect transistor device) and inverted thin film transistor devices. The thin film transistor devices may be employed in conjunction with liquid crystal display driver elements.

Figure 1:
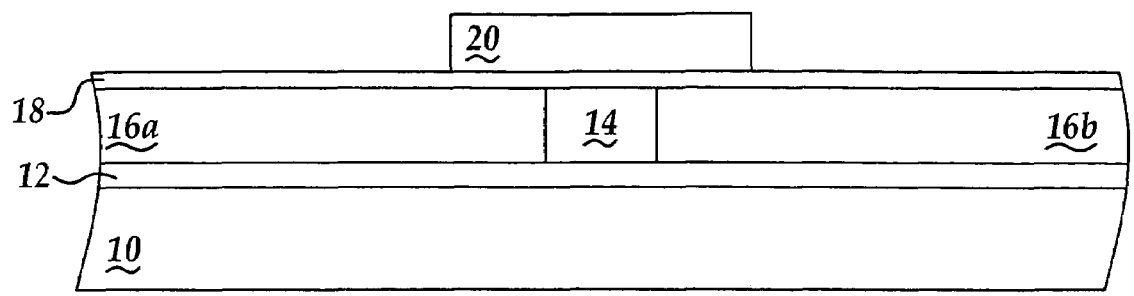
FIG. 1, FIG. 2 and FIG. 3 show a series of schematic cross-sectional diagrams illustrating the results of progressive stages of fabricating a thin film transistor device structure in accord with a preferred embodiment of the invention.
Figure 2:
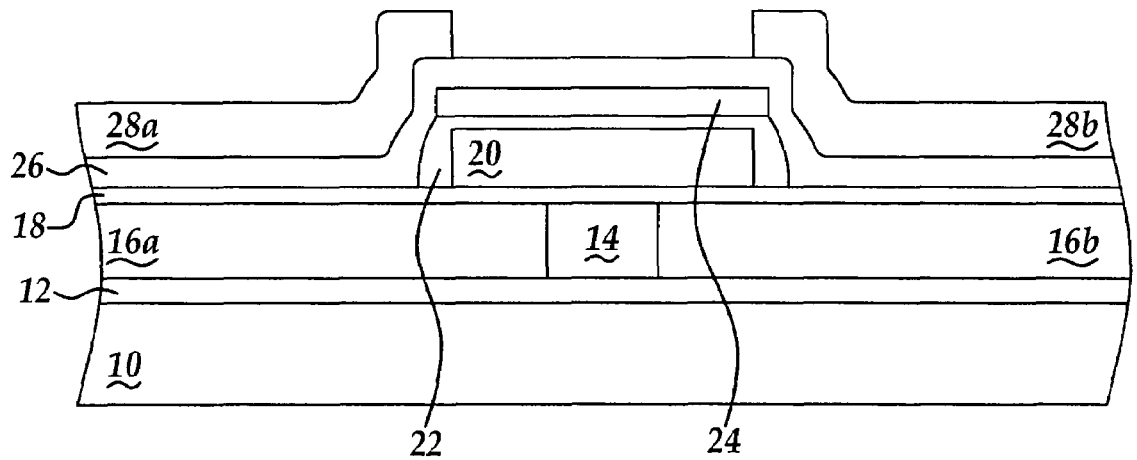
Figure 3:
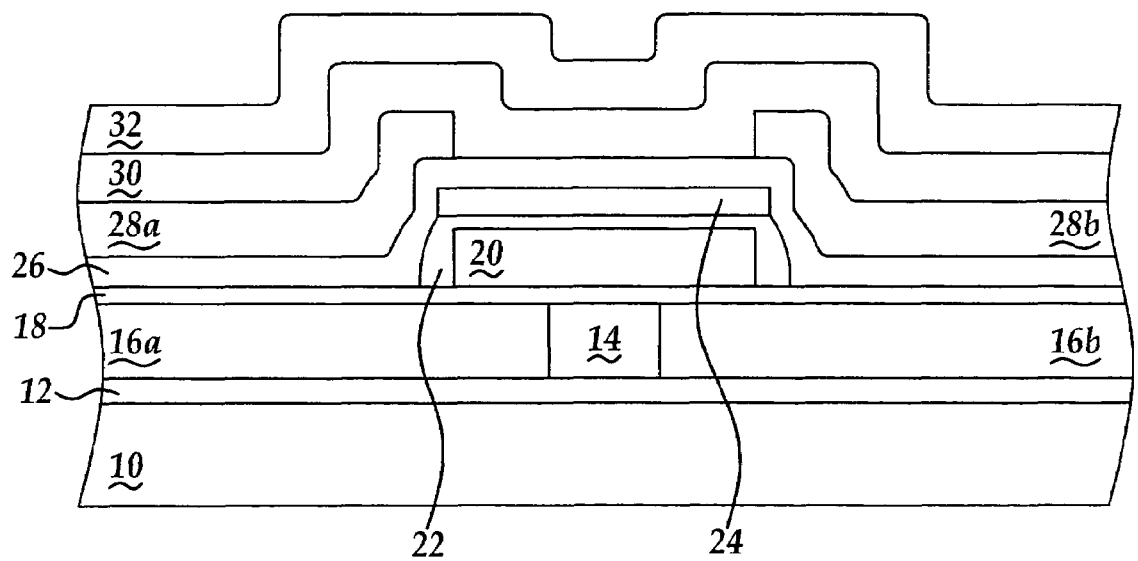

FIG. 1 to FIG. 3 show a series of schematic cross-sectional diagrams illustrating the results of progressive stages of fabricating a thin film transistor device structure in accord with a preferred embodiment of the invention.

FIG. 1 first shows a substrate 10 having formed thereupon a blanket substrate passivation layer 12.

The substrate 10 is typically a transparent substrate, such as a glass substrate or a quartz substrate, typically formed to a thickness of from about 0.05 to about 3 millimeters. The substrate 10 may alternatively be an opaque substrate. The blanket substrate passivation layer 12 is an optional layer within the invention, but typically formed of a dielectric passivation material such as a silicon oxide material, silicon nitride material or a silicon oxynitride material, and typically formed to a thickness of from about 200 to about 2000 angstroms.

FIG. 1 next shows a gate electrode 14 and a pair of patterned planarization layers 16a and 16b formed upon the substrate passivation layer 12, such that a series of upper surfaces of the gate electrode 14 and the pair of patterned planarization layers 16a and 16b is nominally co-planar.

The gate electrode 14 is typically formed of a conductor material, such as but not limited to a metal, metal alloy, doped silicon (i.e., polysilicon or amorphous silicon doped to a concentration of from about 1E18 to about 1E22 dopant atoms per cubic centimeter) or polycide (doped silicon/metal silicide stack) conductor material. Typically, the gate electrode 14 is formed to a thickness of from about 3000 to about 8000 angstroms.

The pair of patterned planarization layers 16a and 16b is typically formed of a dielectric planarization material, such as but not limited to a silicon oxide material, silicon nitride material or silicon oxynitride material. As is illustrated within the schematic cross-sectional diagram of FIG. 1, the pair of patterned planarization layers 16a and 16b is formed to the same thickness of as the gate electrode 14.

Within the invention, either: (1) the pair of patterned planarization layers 16a and 16b; or (2) the gate electrode 14, may be formed employing a planarization method, such as a chemical mechanical polish (CMP) planarizing method, while employing the other of the pair of patterned planarization layers 16a and 16b and the gate electrode 14 as a planarizing stop layer.

Finally, FIG. 1 shows: (1) a blanket gate dielectric layer 18 formed upon the pair of planarization layers 16a and 16b and the gate electrode 14; as well as (2) an active semiconductor layer 20 formed upon the blanket gate dielectric layer 18 and nominally centered above the gate electrode 14.

The blanket gate dielectric layer 18 may be formed of gate dielectric materials as are conventional in the thin film transistor device fabrication art. Typically, the blanket gate dielectric layer 18 is formed of a silicon oxide material formed to a thickness of from about 400 to about 600 angstroms.

The active semiconductor layer 20 may be formed from any of several types of semiconductor materials, such as but not limited to silicon semiconductor materials (amorphous, polycrystalline or crystalline), germanium semiconductor materials and silicongermanium alloy semiconductor materials. Each of the foregoing semiconductor materials will typically have. incorporated therein an appropriate dopant of concentration and polarity to provide the active semiconductor layer 20. Typically, the active semiconductor layer 20 is formed of a silicon semiconductor material, such as an amorphous silicon material or a polycrystalline silicon material, formed to a thickness of from about 3000 to about 3500 angstroms. The active semiconductor layer 20 may be formed with a channel region of linewidth nominally aligned with the gate electrode 14 linewidth. The channel region is doped with a first dopant of a first polarity at a first concentration of from about 1E12 to about 1E14 dopant atoms per cubic centimeter. Under such circumstances, the channel region separates a pair of source/drain regions of the active semiconductor layer 20 having a second polarity opposite the first polarity and a second concentration from about 1E18 to about 1E22 dopant atoms per cubic centimeter.

FIG. 2 first shows the results of forming an encapsulation layer 22 encapsulating the active semiconductor layer 20.

The encapsulation layer 22 may be formed in a self-aligned fashion (as illustrated in FIG. 2) or alternatively the encapsulation layer 22 may be formed as an independent layer. Typically, the encapsulation layer 22 is formed of a silicon oxide material (generally stoichiometric silicon dioxide (i.e., SiO2) that is not a silicon rich silicon oxide material, and formed to a thickness of from about 50 to about 100 angstroms, when formed in a self-aligned fashion.

FIG. 2 next shows a barrier layer 24 formed upon the encapsulation layer 22. The barrier layer 24 is typically formed of a silicon nitride material formed to a thickness of from about 500 to about 700 angstroms.

FIG. 2 further shows an inter-level dielectric (ILD) layer 26 formed upon exposed portions of the gate dielectric layer 18, the encapsulation layer 22 and the barrier layer 24. The inter-level dielectric layer 26 is typically formed of a silicon oxide material formed to a thickness of from about 2000 to about 4000 angstroms. The silicon oxide material is typically formed employing a plasma enhanced chemical vapor deposition (PECVD) method employing tetrethylorthosilicate (TEOS) as a silicon source material and oxygen as an oxidant source material. The silicon oxide material from which is formed the inter-level dielectric layer 26 is also typically not formed of a silicon rich silicon oxide material, but rather a stoichiometric silicon oxide material or an oxygen rich silicon oxide material.

Finally, FIG. 2 shows a pair of patterned conductor layers 28a and 28b formed upon the inter-metal dielectric layer 26. The pair of patterned conductor layers 26a and 26b may be formed of conductor materials including but not limited to metal, metal alloy, doped polysilicon and polycide conductor materials. Typically, each of the patterned conductor layers 28a and 28b is formed to a thickness of from about 5000 to about 20000 angstroms.

FIG. 3 shows a blanket first passivation layer 30 formed upon exposed portions of the pair of patterned conductor layers 28a and 28b, and the blanket inter-metal dielectric layer 26, as well as a blanket second passivation layer 32 formed upon the blanket first passivation layer 30.

Within the invention, the blanket first passivation layer 30 is formed of a silicon rich silicon oxide material and the blanket second passivation layer 32 is typically formed of a silicon nitride material. The blanket second passivation layer is typically formed to a thickness of from about 5000 to about 10000 angstroms and the silicon nitride material is typically formed employing a plasma enhanced chemical vapor deposition method.

The silicon rich silicon oxide material employed for forming the blanket first passivation layer 30 is preferably also formed employing a plasma enhanced chemical vapor deposition method, and formed to a thickness of from about 3000 to about 7000 angstroms. The plasma enhanced chemical vapor deposition method employs silane as a silicon source material and nitrous oxide as an oxidant source material. The silicon rich silicon oxide material is typically characterized by a refractive index of from about 1.51 to about 1.57 (more preferably from about 1.53 to about 1.57), while a conventional nominally stoichiometric silicon oxide material is typically characterized by a refractive index of from about 1.45 to about 1.47.

The plasma enhanced chemical vapor deposition method employed for forming the silicon rich silicon oxide material also employs: (1) a reactor chamber pressure of from about 1 to about 10 torr; (2) a source radio frequency power of from about 10 to about 1000 watts and a bias radio frequency power of from about 10 to about 1000 watts; (3) a substrate temperature of from about 100 to about 300 degrees centigrade; (4) a silane silicon source material: nitrous oxide oxidant source material flow rate ratio of greater than about 0.075 and preferably from about 0.075 to about 0.095; (5) a silane flow rate of from about 50 to about 100 standard cubic centimeters per minute; and (6) a nitrous oxide flow rate of from about 800 to about 1200 standard cubic centimeters per minute.

The thin film transistor device structure of FIG. 3 may be further fabricated by forming: (1) a liquid crystal material layer over the blanket second passivation layer 32; and (2) a transparent plate layer formed over the liquid crystal material layer, such as to provide a laminated construction that may be employed within a liquid crystal display.

FIG. 3 shows a schematic cross-sectional diagram of a thin film transistor device structure formed in accord with a preferred embodiment of the invention. The thin film transistor device structure has formed therein a thin film transistor device with enhanced performance. The thin film transistor device has enhanced performance incident to being formed with a passivation layer formed of a silicon rich silicon oxide material. The thin film transistor device has the enhanced performance even though the passivation layer formed of the silicon rich silicon oxide material is separated from active elements within the thin film transistor device (i.e., an active silicon layer and a gate dielectric layer) by intervening dielectric layers that are formed of non-silicon rich silicon oxide materials (i.e., stoichiometric silicon oxide materials and oxygen rich silicon oxide materials).

EXAMPLES

Several series of thin film transistor device structures were fabricated in accord with the preferred embodiment of the invention as illustrated in FIG. 3. The several series of thin film transistor device structures differed only with respect to composition of a blanket first passivation layer, which was formed of either a silicon rich silicon oxide material (of index of refraction from about 1.51 to about 1.57) or a nominally stoichiometric silicon oxide material (of index of refraction of about 1.46).

Threshold voltage shifts and threshold voltage drifts were then measured for the series of thin film transistor device structures. For the series of thin film transistor device structures formed employing the silicon rich silicon oxide material passivation layers, the thin film transistor devices had threshold voltage shifts in the 1–9 mV range and threshold voltage drifts in the 0–5 mV range. For the series of thin film transistor device structures formed employing the nominally stoichiometric silicon oxide material passivation layers, thin film transistor devices had threshold voltage shifts in the 6–11 mV range and threshold voltage drifts in the 25–48 mV range. Review of the foregoing data clearly provides for enhanced performance of thin film transistor devices within thin film transistor device structures formed employing silicon rich silicon oxide material passivation layers in comparison with nominally stoichiometric silicon oxide material passivation layers.

While not wishing to be bound by any particular theory of operation of the invention, it is believed that a silicon rich silicon oxide passivation material provides enhanced passivation incident to providing dangling bonds which provide for enhanced plasma charge trapping when forming a passivation layer therefrom.

The preferred embodiment and examples of the invention is illustrative of the invention rather than limiting of the invention. Revisions and modifications may be made to methods, materials, structures and dimensions of the preferred embodiments and examples of the invention while still providing embodiments and examples of the invention, further in accord with the accompanying claims.

What is claimed is:

1. A thin film transistor device structure comprising:
    a substrate;
    a thin film transistor device formed over the substrate;
    a passivation layer formed over the thin film transistor device, where the passivation layer is formed of a silicon rich. silicon oxide material;
    wherein a second passivation layer is formed over the passivation layer, the additional passivation layer being formed of a nitride.

2. The thin film transistor device structure of claim 1 wherein the thin film transistor is not inverted with respect to the substrate.

3. The thin film transistor device structure of claim 1 wherein the thin film transistor is inverted with respect to the substrate.

4. The thin film transistor device structure of claim 1 wherein the silicon rich silicon oxide material has a refractive index of from about 1.51 to about 1.57.

5. The thin film transistor device structure of claim 1 wherein the silicon rich silicon oxide material has a refractive index of from about 1.53 to about 1.57.

6. The thin film transistor device structure of claim 1 wherein the passivation layer is formed to a thickness of from about 3000 to about 7000 angstroms.

* * * * *